(12) United States Patent
Brahmasandra et al.

(10) Patent No.: US 11,338,295 B2
(45) Date of Patent: *May 24, 2022

(54) THERMOCYCLING SYSTEM AND MANUFACTURING METHOD

(71) Applicant: NeuMoDx Molecular, Inc., Ann Arbor, MI (US)

(72) Inventors: Sundaresh Brahmasandra, Ann Arbor, MI (US); Thomas Haddock, Ann Arbor, MI (US); Patrick Duffy, Whitmore Lake, MI (US); Jeffrey Williams, Chelsea, MI (US)

(73) Assignee: NeuMoDx Molecular, Inc., Ann Arbor, MI (US)

( * ) Notice: Subject to any disclaimer, the term of this patent is extended or adjusted under 35 U.S.C. 154(b) by 52 days.

This patent is subject to a terminal disclaimer.

(21) Appl. No.: 16/264,262

(22) Filed: Jan. 31, 2019

(65) Prior Publication Data

US 2019/0160469 A1 May 30, 2019

Related U.S. Application Data

(60) Division of application No. 15/363,107, filed on Nov. 29, 2016, now Pat. No. 10,226,771, which is a
(Continued)

(51) Int. Cl.
*B01L 3/00* (2006.01)
*B01L 1/00* (2006.01)
*B01L 7/00* (2006.01)
(Continued)

(52) U.S. Cl.
CPC ............... *B01L 7/52* (2013.01); *H05K 1/18* (2013.01); *H05K 3/30* (2013.01); *H05K 3/4644* (2013.01);
(Continued)

(58) Field of Classification Search
CPC ............... B01L 3/502723; B01L 7/525; B01L 2300/1822
See application file for complete search history.

(56) References Cited

U.S. PATENT DOCUMENTS 5,563,067 A 10/1996 Sugihara et al.
2002/0028507 A1 3/2002 Heimberg et al.
(Continued)

*Primary Examiner* — Nathan A Bowers
(74) *Attorney, Agent, or Firm* — Sterne, Kessler, Goldstein & Fox P.L.L.C.

(57) ABSTRACT

A system for thermocycling biological samples within detection chambers comprising: a set of heater-sensor dies, each heater-sensor die comprising a heating surface configured to interface with a detection chamber and a second surface, inferior to the heating surface, including a first connection point; an electronics substrate, comprising a first substrate surface coupled to the second surface of each heater-sensor die, an aperture providing access through the electronics substrate to at least one heater-sensor die, and a second substrate surface inferior to the first substrate surface, wherein the electronics substrate comprises a set of substrate connection points at least at one of the first substrate surface, an aperture surface defined within the aperture, and the second substrate surface, and wherein the electronics substrate is configured to couple heating elements and sensing elements of the set of heater-sensor dies to a controller; and a set of wire bonds, including a wire bond coupled between the first connection point of at least one of the set of heater-sensor dies and one of the set of substrate connection points.

20 Claims, 10 Drawing Sheets

Related U.S. Application Data continuation of application No. 14/487,837, filed on Sep. 16, 2014, now Pat. No. 9,539,576.

(60) Provisional application No. 61/879,517, filed on Sep. 18, 2013.

(51) Int. Cl.
  *H05K 1/18*    (2006.01)
  *H05K 3/30*    (2006.01)
  *H05K 3/46*    (2006.01)

(52) U.S. Cl.
  CPC ..... *B01L 2200/12* (2013.01); *B01L 2200/147* (2013.01); *B01L 2300/0819* (2013.01); *B01L 2300/123* (2013.01); *B01L 2300/168* (2013.01); *B01L 2300/1827* (2013.01); *H05K 2201/10151* (2013.01); *Y10T 29/49083* (2015.01)

(56) References Cited

U.S. PATENT DOCUMENTS

| | | |
|---|---|---|
| 2003/0157587 A1 | 8/2003 | Gomez et al. |
| 2004/0086424 A1 | 5/2004 | Schembri |
| 2004/0151629 A1 | 8/2004 | Pease et al. |
| 2008/0269066 A1 | 10/2008 | Flechsig et al. |
| 2010/0086991 A1 | 4/2010 | Fish |
| 2011/0268151 A1 | 11/2011 | Hadwen et al. |
| 2011/0272575 A1 | 11/2011 | Kim et al. |
| 2012/0230887 A1 | 9/2012 | Zucchelli |
| 2013/0071305 A1 | 3/2013 | Gosnet-Haghiri et al. |
| 2013/0102064 A1 | 4/2013 | Fontana et al. |
| 2014/0057283 A1 | 2/2014 | Wang et al. |
| 2014/0273188 A1 | 9/2014 | Mohan et al. |
| 2017/0226579 A1* | 8/2017 | Ansari ............... B01L 7/52 |

* cited by examiner

THERMOCYCLING SYSTEM AND MANUFACTURING METHOD

CROSS-REFERENCE TO RELATED APPLICATIONS

This application is a divisional of U.S. patent application Ser. No. 15/363,107 filed 29 Nov. 2016, which is a continuation of U.S. patent application Ser. No. 14/487,837, filed 16 Sep. 2014, which claims the benefit of U.S. Provisional Application Ser. No. 61/879,517 filed 18 Sep. 2013, both of which are incorporated in their entirety herein by this reference. This application is also related to U.S. application Ser. No. 14/487,808 filed 16 Sep. 2014, which is incorporated herein in its entirety by this reference.

TECHNICAL FIELD

This invention relates generally to the molecular diagnostics field, and more specifically to an improved sample thermocycling system and assembly method thereof.

BACKGROUND

Molecular diagnostics is a clinical laboratory discipline that has developed rapidly during the last 25 years. It originated from basic biochemistry and molecular biology research procedures, but now has become an independent discipline focused on routine analysis of nucleic acids (NA), including deoxyribonucleic acid (DNA) and ribonucleic acid (RNA) for diagnostic use in healthcare and other fields involving analysis of nucleic acids. Molecular diagnostic analysis of biological samples can include the detection of one or more nucleic acid materials present in the specimen. The particular analysis performed may be qualitative and/or quantitative. Methods of analysis typically involve isolation, purification, and amplification of nucleic acid materials, and polymerase chain reaction (PCR) is a common technique used to amplify nucleic acids. Often, a nucleic acid sample to be analyzed is obtained in insufficient quantity, quality, and/or purity, hindering a robust implementation of a diagnostic technique. Current sample processing methods and molecular diagnostic techniques are often labor/time intensive, low throughput, and expensive, and systems of analysis are insufficient.

A rapid and efficient thermocycling system that can reliably thermocycle reagents used for processing of nucleic acids can significantly improve the efficiency and effective implementation of molecular diagnostic techniques, such as realtime polymerase chain reaction (RT-PCR). Microfabrication techniques can produce such thermocycling systems comprising precision heaters with low thermal masses and with well-coupled temperature sensors. However, challenges are inherent in ensuring that the microfabrication and assembly processes utilized to fabricate thermal cycling elements are extremely robust and reliable.

Due to these challenges and deficiencies of current molecular diagnostic systems and methods, there is thus a need for an improved sample thermocycling system and assembly method thereof. This invention provides such a system and assembly method.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. System

Figure 1A:
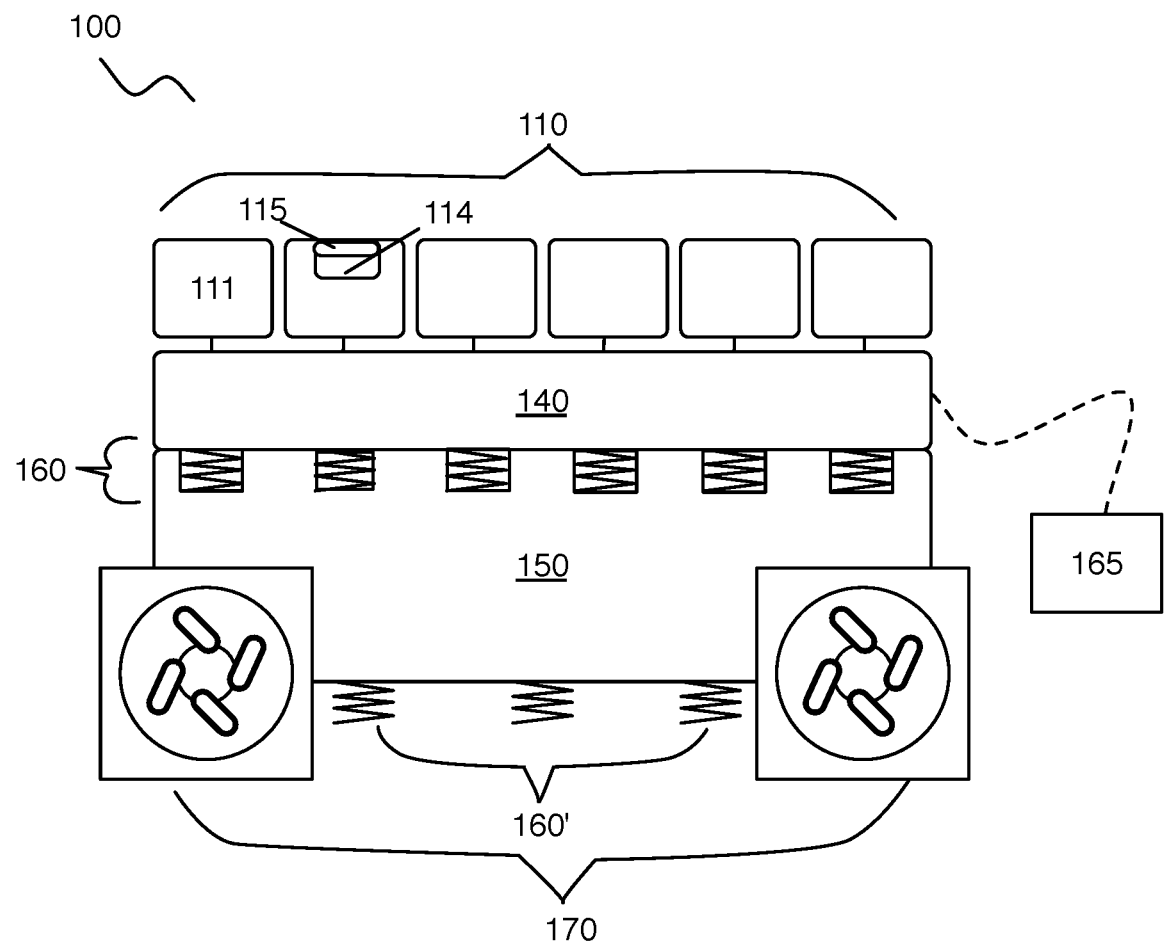
FIGS. 1A and 1B depict embodiments of a thermocycling system.
Figure 1B:
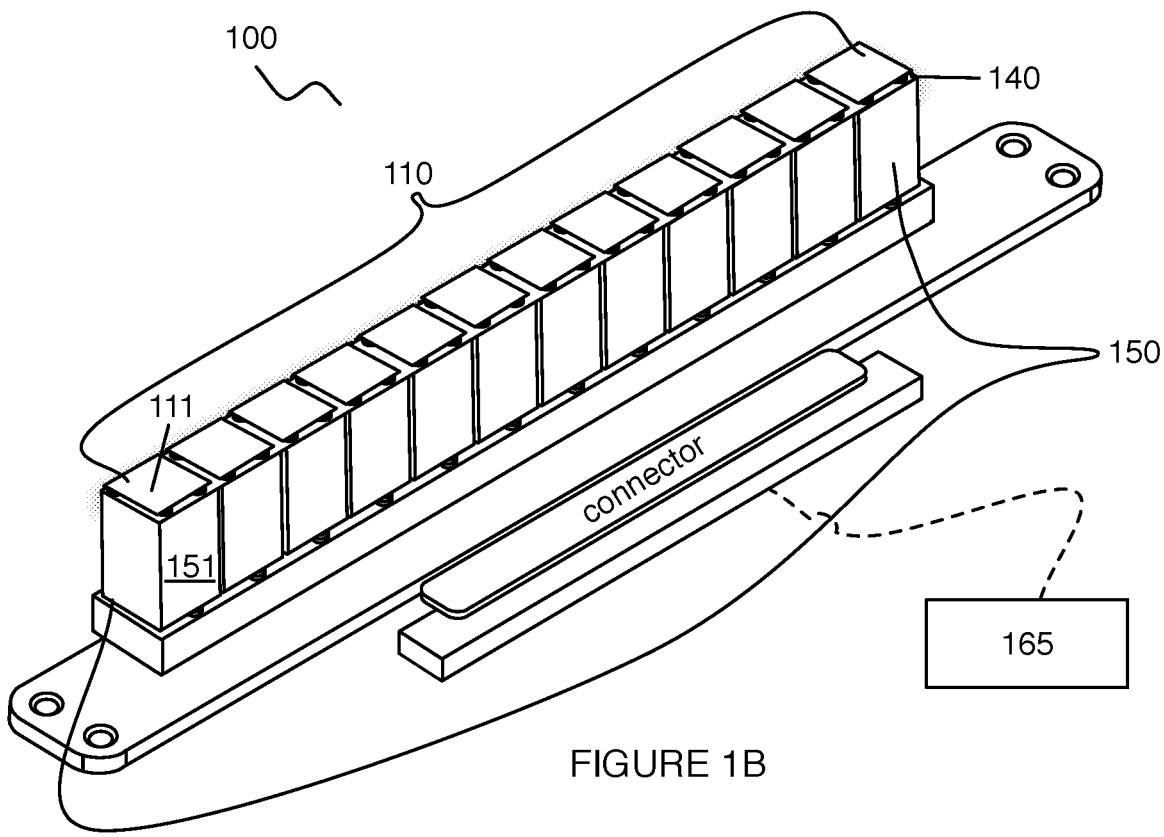

As shown in FIGS. 1A and 1B, an embodiment of a sample thermocycling system 100 comprises: a set of heater-sensor dies 110; an electronics substrate 140 configured to couple heating elements and sensing elements of the set of heater-sensor dies to a controller; a set of heat sink supports 150 coupled to at least one of the electronics substrate and the set of heater-sensor dies; and a set of elastic elements 160 coupled to the electronics substrate and configured to bias each of the set of heater-sensor dies against a detection chamber. In some embodiments, the system 100 further comprises a controller 165 coupled to the electronics substrate and configured to automate and/or control relevant heating parameters of the system 100, and can further comprise a cooling subsystem 170 configured to dissipate heat from the system 100. The system 100 functions to enable rapid thermocycling of samples while providing uniform heating and preventing mechanical failure of the system 100 during thermocycling. In specific applications, the system 100 can be used to rapidly and controllably thermocycle nucleic acid samples during performance of molecular diagnostic amplification techniques (e.g., PCR, RT-PCR), signal amplification techniques (e.g., bDNA, hybrid capture), and analytical techniques (e.g., gel electrophoresis, mass spectrometry). In some variations, the system 100 can be integrated into a molecular diagnostic system, such as that described in U.S. Pub. No. 2013/0210015, entitled "System and Method for Processing and Detecting Nucleic Acids", and filed on 13 Feb. 2013; however, the system 100 can additionally or alternatively be used with any other suitable system for processing biological or non-biological samples.

1.1 Heater-Sensor Dies

The set of heater-sensor dies 110 functions to controllably heat individual sample volumes. Preferably, each heater-sensor die 111 is a thin-film die that can be deposited onto another substrate (e.g., silicon substrate, glass substrate) that can be packaged onto an electronics substrate 140; however, each heater-sensor die 111 can alternatively comprise any suitable geometry and/or configuration that enables controlled, uniform, and rapid sample heating of a detection chamber in thermal communication with the heater-sensor die 111. In some embodiments, the detection chambers can be those described in U.S. Pub. No. 2013/0209326, entitled "Microfluidic Cartridge for Processing and Detecting Nucleic Acids" and filed on 13 Feb. 2013, which is herein incorporated in its entirety by this reference; however, the detection chambers can alternatively be any other suitable container for processing a biological sample. Preferably, each heater-sensor die 111 is characterized by a small profile (e.g., <10 mm dimension), which ensures that the heater-sensor die 111 is able to thermocycle extremely rapidly; however, a heater-sensor dies 111 can alternatively be characterized by any suitable profile. Additionally, each heater-sensor die 111 is preferably configured to conform to a detection chamber (e.g., sample tube, sample container, sample heating zone of a cartridge for processing samples) configured to contain a sample during heating; however, a heater-sensor die 111 in the set of heater-sensor dies 110 can alternatively not conform to a sample container. In one variation, each heater-sensor die 111 can be coupled to a thermally conductive element (e.g., 600 micron×5×5 mm silicon spacer) using thermally conductive grease or another suitable material. In this variation, a connection between a heater-sensor die is thus protected against failure due to shear forces that can result from placement of a sample container on a heater-sensor die 111. Other variations of preventing connection failure are described in Section 1.2 below.

Figure 2:
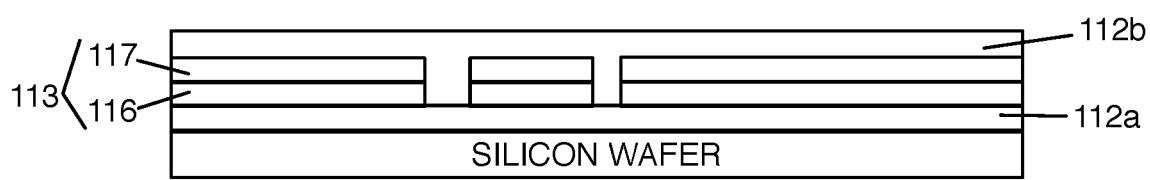
FIG. 2 depicts an example schematic of a heater-sensor die during fabrication in an example of a thermocycling system.

Preferably, each heater-sensor die 111 in the set of heater sensor dies 110 comprises an insulating layer 112 that functions to provide an insulating barrier to isolate the heaters and sensors and a heating region 113 that functions to provide uniform sample heating, as shown in FIG. 2. The insulating layer 112 is preferably electrically insulating, but can additionally be thermally insulating. Furthermore, each heater-sensor die 111 preferably comprises two insulating layers 112 that are configured to "sandwich" the heating region 113, thus isolating the heating region 113; however, each heater-sensor die 111 can alternatively comprise any suitable number of insulating layers 112 arranged relative to the heating region 113 in any suitable manner. The heating region 113 preferably comprises a heating element 114 with an integrated sensing element 115, and is composed of a metal or metal alloy. Furthermore, the heating region 113 is preferably defined by a pattern defined by geometric features (e.g., width, thickness, length, spacing) that facilitate uniform heating. However, in variations, the heating region 113 can alternatively not comprise an integrated sensing element 115, can comprise any suitable number of heating elements 114/sensing elements 115, and/or can be composed of any other suitable material.

Figure 3:
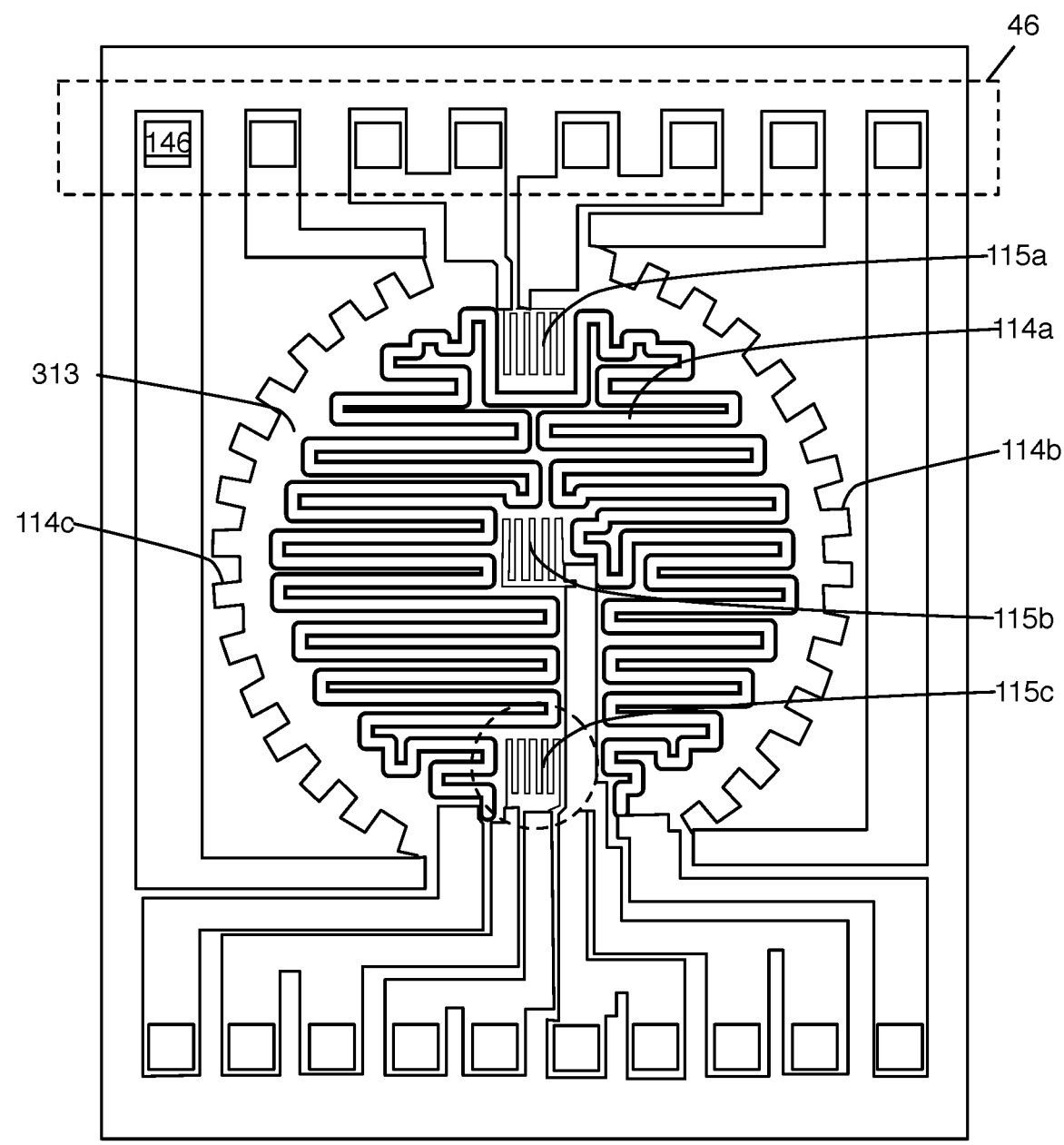
FIG. 3 depicts an example of heating and sensing elements in an example of a thermocycling system.

In a first specific example of a heater-sensor die 111, as shown in FIG. 3, a heater-sensor die 111 is configured to uniformly heat a circular region having a diameter of 5 mm, spans a region of 8.6 mm×7 mm, and comprises three heating elements 114a, 114b, 114c: a central circular heating element 114a and two circumferential heating elements 114b, 114c configured to form a boundary about the central circular heating element. The heater-sensor die 111 in the first specific example further comprises three integrated sensing elements 115a, 115b, 115c (i.e., resistance temperature sensors, RTDs) distributed at three locations within the 5 mm circular region. In the first specific example, the heating region was 113 etched away in a boustrophedonic pattern, designed using a layout editor (e.g., Mentor Graphics™ or L-Edit™), to form the heating surface. The heating elements 114 are defined by coarser patterning, and the sensing elements 115 are defined by finer patterning, as shown in FIG. 3A. Other variations and examples of the heater-sensor dies 111 can comprise any suitable patterning configuration and/or any suitable arrangement of insulating layer(s) 112a, 112b and heating region(s) 113.

1.2 Other System Elements

Figure 9A:
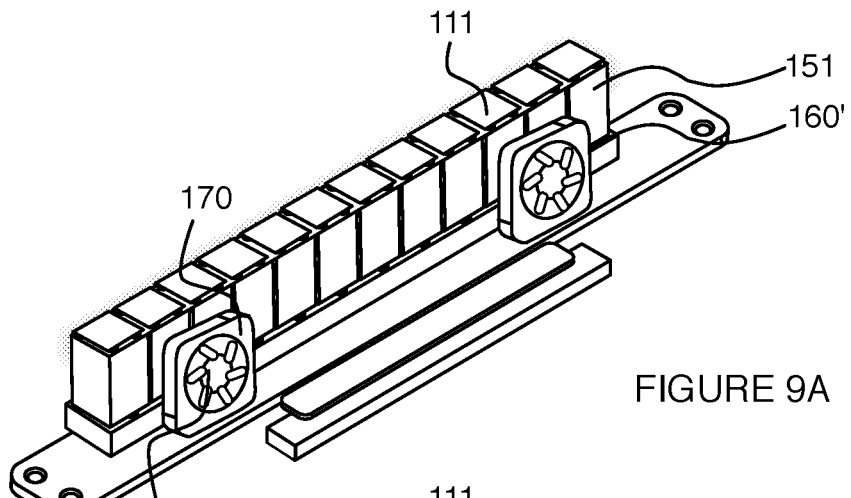
FIGS. 9A-9C depict variations of configurations of additional elements in an embodiment of a thermocycling system.
Figure 9B:
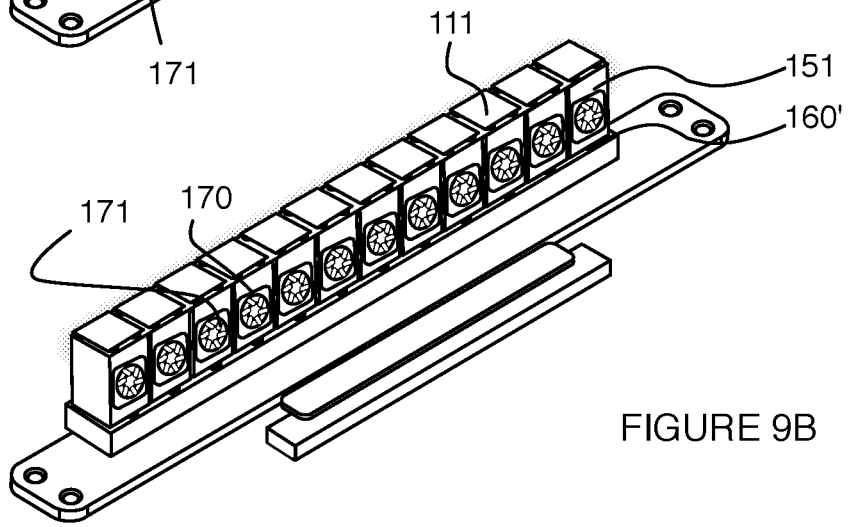

As shown in FIGS. 1A and 1B, the system 100 further comprises an electronics substrate 140 and a set of heat-sink supports 150. Furthermore, the system 100 can additionally comprise a controller 165 configured to automate and/or control relevant heating parameters of the system 100, and/or a cooling subsystem 170 configured to dissipate heat from the system 100, as shown in FIGS. 9A and 9B.

Figure 4:
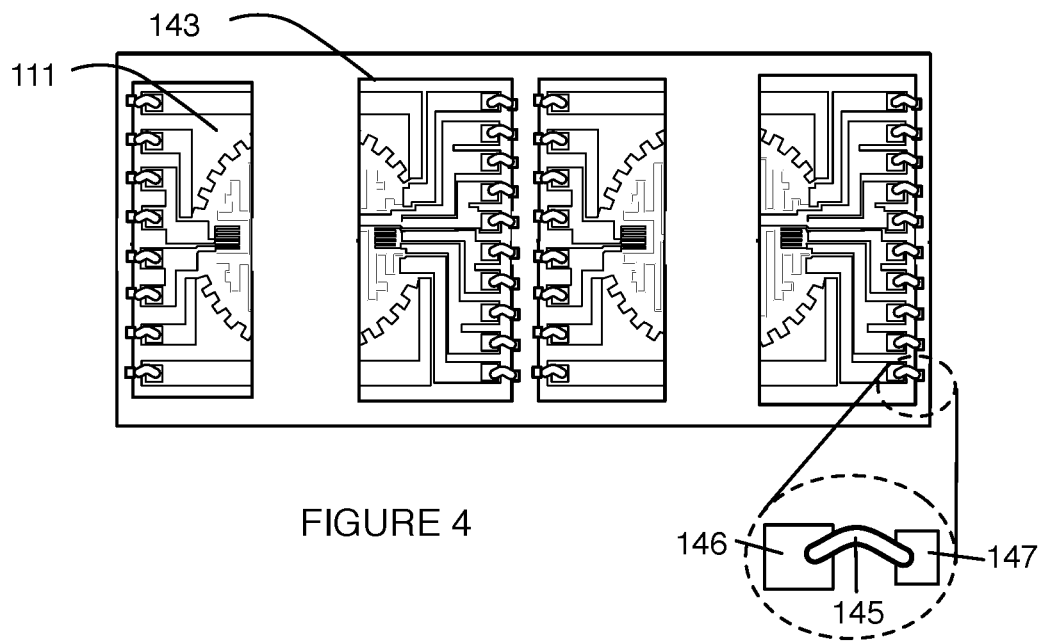
FIG. 4 depicts examples of additional elements of an embodiment of a thermocycling system.

The electronics substrate 140 is preferably coupled to the set of heater-sensor dies 110, and functions to enable communication between each heater-sensor die 111 in the set of heater sensor dies 110 and a controller 165. The electronics substrate 140 preferably comprises a printed circuit board (PCB), and in some variations, comprises a flexible PCB, as shown in FIG. 4, in order to facilitate contact between heater-sensor dies 111 in the set of heater-sensor dies 110 and detection chambers (e.g., reaction vessels, detection chambers) for processing according to molecular diagnostic protocols. Alternatively, the electronics substrate 140 can alternatively comprise a rigid PCB or any other suitable PCB. Furthermore, the system 100 can comprise any suitable number of PCBs. Preferably, the set of heater-sensor dies 110 is assembled onto the electronics substrate in a manner that provides thermal and/or electrical isolation of each die 111 from the neighboring die(s), in particular, for variations wherein the electronics substrate 140 is characterized as having poor conductivity. However, the electronics substrate 140 and the set of heater-sensor dies 110 can be configured in any alternative suitable manner that provides isolation of each die 111.

Figure 5A:
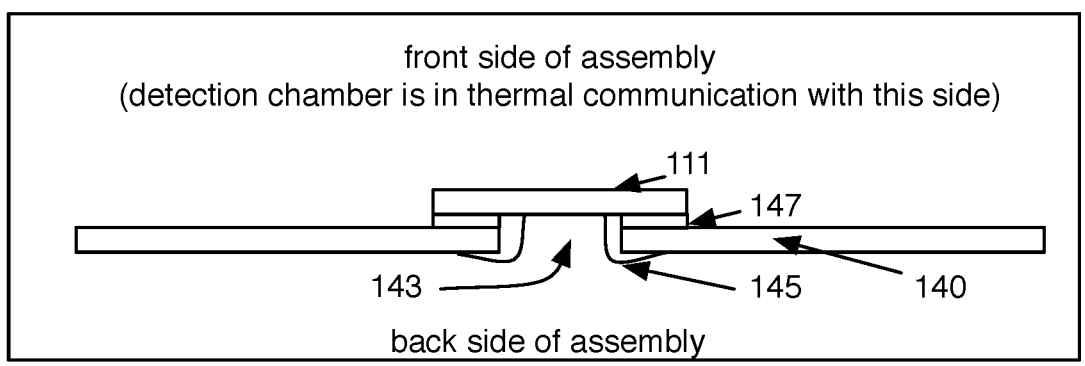
FIGS. 5A and 5B depict examples of reverse wire bonding in embodiments of a thermocycling system.
Figure 5B:
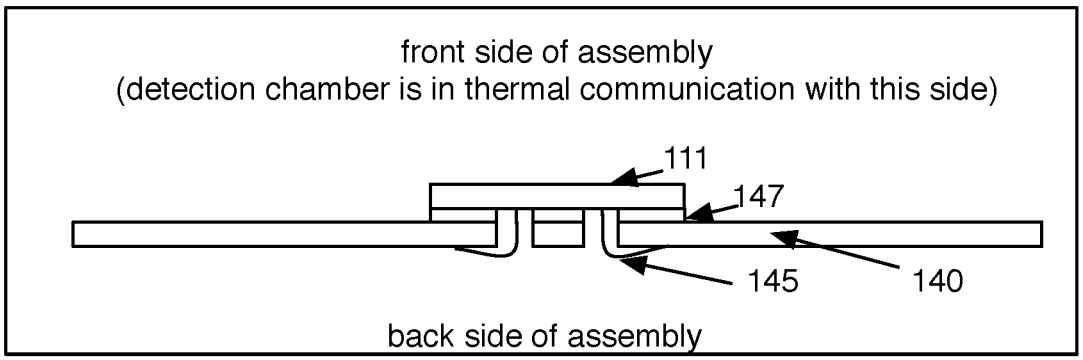

Preferably, the electronics substrate 140 is configured to couple to a heater-sensor die 111 by a reverse wire bond 145 coupled between a first connection point 146 (i.e., contact pad) of a set of connection points 46 on the heater-sensor die 111 and a second connection point 147 (i.e., pad) on the electronics substrate 140, as shown in FIGS. 4 and 5A-5B. The reverse wire bond 145 functions to prevent unbonding of a heater-sensor die 111 from the electronics substrate 140 that can result from shear forces on at least one of the heater-sensor die 111 and the wire bond 145 and/or fatigue of the wire bond 145 during thermocycling. The reverse wire bond 145 can be made from a back-side of the electronics substrate 140, in the orientation shown in FIGS. 5A-5B, through an aperture 143 defined within the electronics substrate 140. The aperture 143 can be a single aperture, or a set of apertures corresponding to the set of heater-sensor dies 110, and furthermore, multiple heater-sensor dies 111 of the set of heater-sensor dies 110 can be configured to couple to the electronics substrate 140 through an aperture 143 defined within the electronics substrate 140. As such, the mappings between pads on the heater-sensor dies 110 and the electronics substrate 140 can be one-to-one or many-to-one in variations of coupling. In one variation, a set of apertures can be longitudinally spaced across the electronics substrate 140; however, in other variations, the set of apertures can be distributed across the electronics substrate 140 in any other suitable manner. Also shown in FIGS. 5A-5B, coupling between the electronics substrate 140 and a heater-sensor die 111 can additionally comprise an adhesive layer 148 comprising cyanoacrylate and/or any other suitable adhesive material configured between the electronics substrate 140 and the heater-sensor die 111. In variations of heater-sensor die 111 coupling to the electronics substrate 140 with an adhesive layer 148, the adhesive layer is preferably heat resistance in order to prevent failure at the adhesive layer 148 during thermocycling.

Figure 6A:
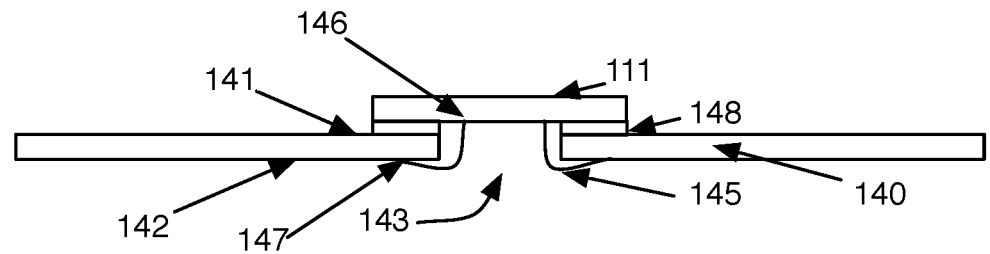
FIGS. 6A-6D depict examples of reverse wire bonding in embodiments of a thermocycling system.

In a first variation, as shown in FIG. 6A, a heater-sensor die 111 is configured to couple to a first side 141 of the electronics substrate 140 by a wire bond 145 that passes through an aperture 143 defined within the electronics substrate 140, such that the wire bond 145 couples at one end to a second side 142 of the electronics substrate 1400. In this variation, a first connection point 146 on a surface of the heater-sensor die 111 closer to the first side 141 of the electronics substrate 140 is coupled to a second connection point 147 on the second side of the electronics substrate 140, by way of the aperture 143 and the reverse wire bond 145. In the first variation, the heater-sensor die 111 can be further stabilized in place by an adhesive layer 148 located between the first side 141 of the electronics substrate 140 and the heater-sensor die 111. Furthermore, while one wire bond 145 is described, the electronics substrate 140 can include a set of connection points distributed at regions of the second substrate surface between adjacent apertures of a set of apertures of the electronics substrate 140.

Figure 6B:
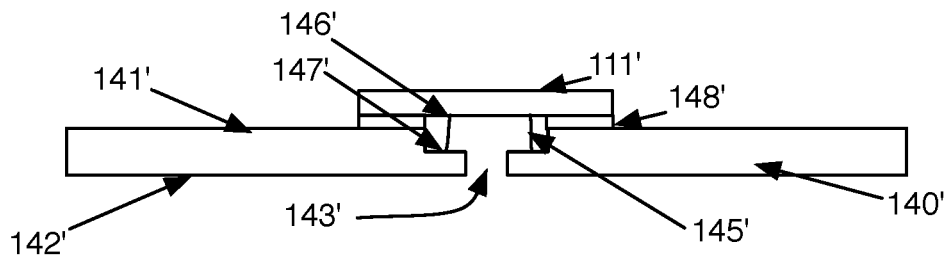

In a second variation, as shown in FIG. 6B, a heater-sensor die 111' is configured to couple to a first side 141' of the electronics substrate 140' by a wire bond 145' that passes into an aperture 143' defined within the electronics substrate 140. In this variation, the wire bond 145 couples, at a first connection point 146', to a surface of the heater-sensor die 111 closer to the first side 141' of the electronics substrate 140' and terminates at a second connection point 147' part-way between a first side 141' and a second side 142' of the electronics substrate 140', such that the wire bond 145' is not exposed at the second side of the electronics substrate 140'. In the second variation, the heater-sensor die 111' can also be stabilized in place by an adhesive layer 148' located between the first side 141' of the electronics substrate 140' and the heater-sensor die.

Figure 6C:
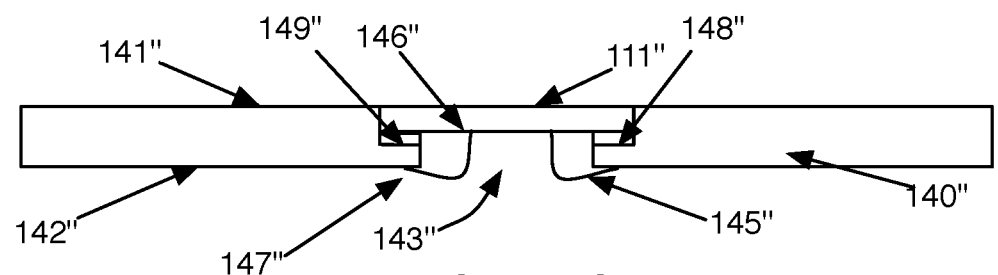
Figure 6D:
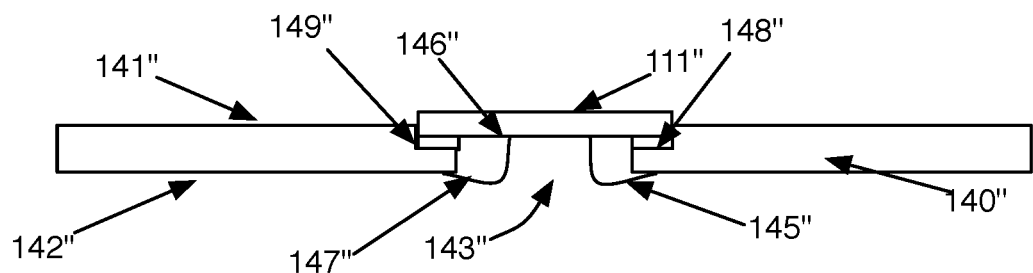

In a third variation, as shown in FIGS. 6C and 6D, a heater-sensor die 111" is configured to rest within a recess 149" at the first side of the electronics substrate 140", wherein the recess 149" is connected to (e.g., contiguous with) an aperture 143" defined within the electronics substrate 140". As shown in FIG. 6C, the recess 149" can be configured such that a heating surface of the heater-sensor die 111 is flush with a first surface 141" of the electronics substrate 140"; however, in an example shown in FIG. 6D, the recess can also be configured such that a heating surface of the heater-sensor die 111" is not flush with the first surface 141" of the electronics substrate 140". In the third variation, the wire bond 145" couples, at a first connection point 146", to a surface of the heater-sensor die 111" partially situated within the electronics substrate 140", and terminates at a second connection point 147" either part-way between the first side 141" and a second side 142" of the electronics substrate 140" (as in the second variation), or at a second point 147" at the second side 142" of the electronics substrate 140" (as in the first variation). Thus, in the third variation, a surface of the heater-sensor die 111" is stabilized within the recess 149" of the electronics substrate 140" to further prevent shearing or other forms of mechanical failure that could compromise coupling between the heater-sensor die 111" and the electronics substrate 140". In the third variation, the heater-sensor die 111" can also be further stabilized within the recess 149" by an adhesive layer 148" between the recess 149" and the heater-sensor die 111". While a single recess is described, the electronics substrate 140" can include a set of recess, each contiguous with at least one aperture of set of apertures of the electronics substrate 140.

Other variations of the reverse wire bond(s) 145 between a heater-sensor die 111 and the electronics substrate 140 can comprise any suitable combination of the above variations, and can additionally or alternatively comprise any suitable encapsulation, embedding, or potting of wire bonds to further prevent failure in the wire bonds.

Figure 7A:
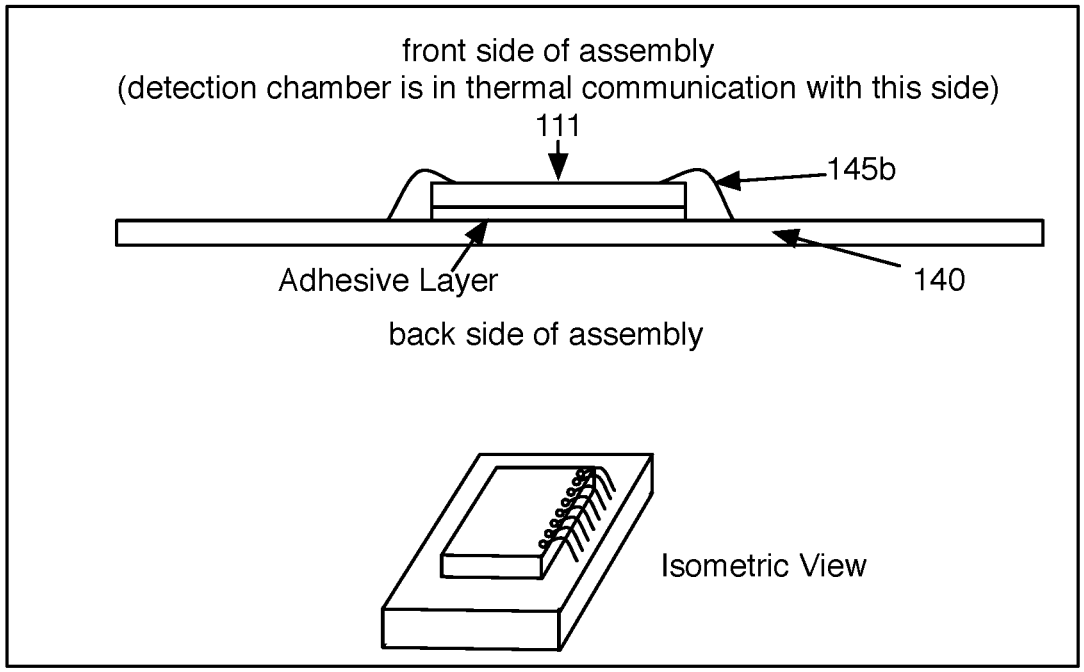
FIGS. 7A-7B depict variations of configurations of elements in an embodiment of a thermocycling system.
Figure 7B:
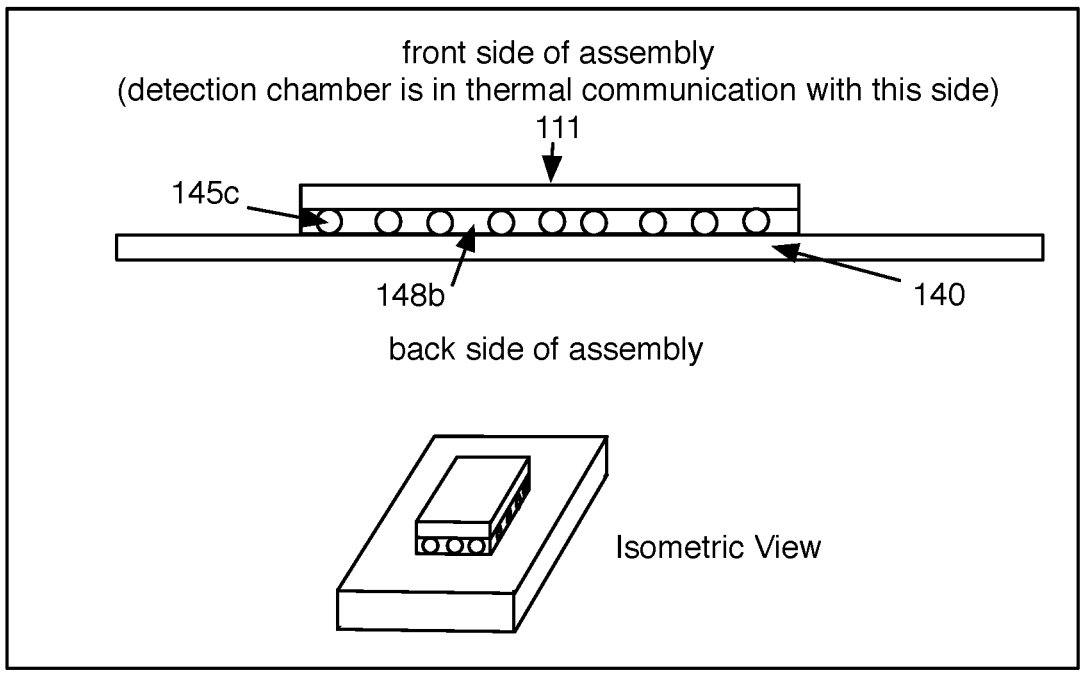

In still other variations, each heater-sensor die 111 can be coupled to the electronics substrate 140 by any other suitable method. In one variation, the coupling can comprise a "top-side" wire bond 145b, as shown in FIG. 7A. In this variation, a thin wire (e.g., 10-300 microns thick) composed of an electrically conductive material (e.g., aluminum, gold, or copper wire) is coupled between a first connection point 146 on the heater-sensor die 111 and a second connection point 147 on a second side 142 of the electronics substrate 140, in the orientation shown in FIG. 7A. Furthermore, in this variation, the "top-side" wire bonds 145b are potted, embedded, and/or encapsulated to protect them from mechanical failure. In another variation, the coupling can comprise a flip-chip bond 145c, as shown in FIG. 7B. In this variation, a volume (e.g., ball) of solder is placed between a first connection point 146 on a heater-sensor die 111 and a second connection point 147 on the electronics substrate 140. Furthermore, in this variation, a filler material 148b can be placed in regions between the electronics substrate 140 and the heater-sensor die 111 not connected by a volume of solder of the flip-chip bond 145c. In other variations, the coupling can additionally or alternatively comprise any suitable adhesive (e.g., cyanoacrylate adhesive) layer 148 configured between the heater-sensor die 111 and the electronics substrate 140.

The set of heat sink supports 150 is preferably coupled to at least one of the set of heater-sensor dies 110 and the electronics substrate 140 and functions to facilitate rapid thermocycling by dissipating heat from the set of heater-sensor dies 110 and/or the electronics substrate 1400. The set of heat sink supports 150 can further function to provide structural support for the set of heater-sensor dies 110, such that the set of heater-sensor dies 110 is supported during compression (e.g., compression against a set of detection chambers) and/or tension. In the absence of heat sinking, the electronics substrate 140 and the surrounding environment can potentially retain too much heat, which compromises the cooling of the set of heater-sensor dies 110. The set of heat sink supports 150 can comprise multiple heat sink supports 151 configured to define any suitable number of contact locations, or can alternatively comprise a single heat sink support 151 configured to define any suitable number of contact locations. As shown in FIGS. 6A and 6B, the system 100 preferably couples to a detection chamber (e.g., reaction vessel, detection chamber) from a first side 101a of the system, which can restrict heat dissipation from the first side 101a of the system. Furthermore, the second side 101b of the system 100 is typically used for optical imaging for monitoring (e.g., realtime monitoring, delayed monitoring), and further limiting heat-sinking from the second side 101b. Thus, it is preferable for the set of heat sink supports 150 to couple to the system 100 from a side of the system 100 that does not physically interfere with optical imaging apparatus interfacing with the system 100. However, alternative configurations of the set of heat sink supports 150 can comprise coupling at any suitable side and/or any number of sides of the system 100.

Figure 8A:
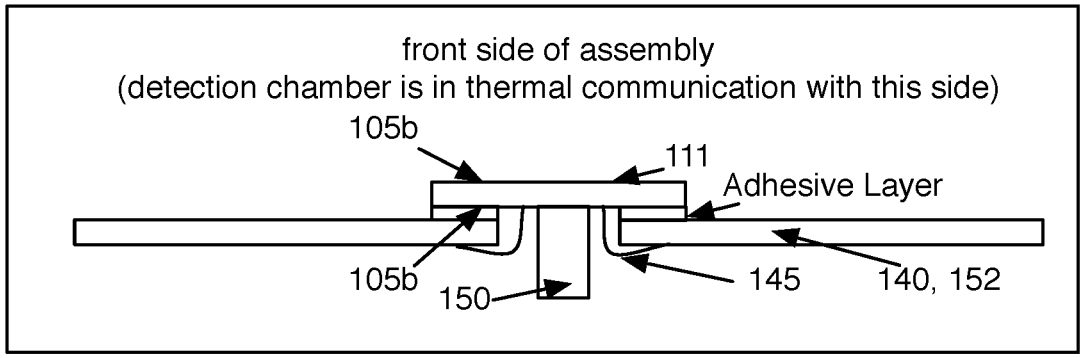
FIGS. 8A-8C depict variations of configurations of elements in an embodiment of a thermocycling system.
Figure 8B:
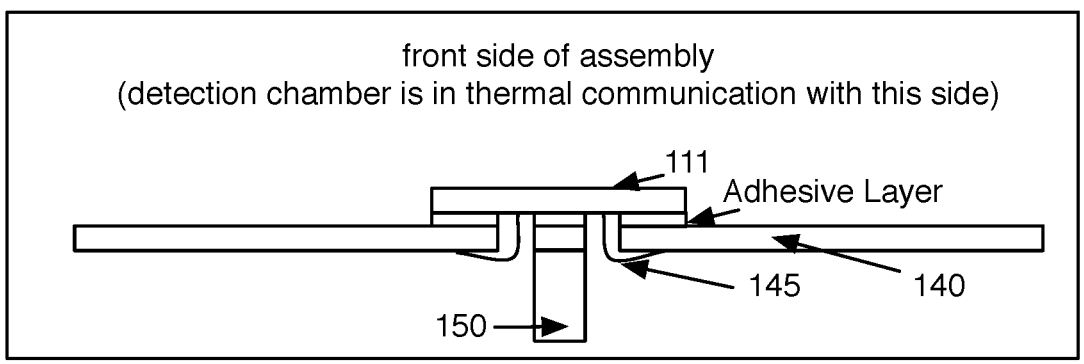

As shown in FIGS. 8A and 8B, the set of heat sink supports 150 can be configured in any of a number of variations. In a first variation, each heat sink support 151 can be directly placed against a first surface 105a of heater-sensor die 111 opposing that of a second surface 105b contacting a detection chamber, as shown in FIG. 7A. The first variation enables efficient transfer of heat out of the first surface 105a of the heater-sensor die away from a respective detection chamber; however, excessive heat sinking can affect heating ramp rates. In a second variation, the system 100 comprises a thermally insulating assembly 152 between a heater-sensor die 111 and a corresponding heat sink support 151, as shown in FIG. 7B. In the second variation, the electronics substrate 140 can serve as the thermally insulating assembly 152 and can be situated between the heater-sensor die 111 and a heat sink support 151. Furthermore, in the second variation, a suitable thermal resistance provided by the electronics substrate 140 (e.g., through thickness, material selection, a combination of features) could produce a thermal couple between the heater-sensor die 111 and the heat sink support 151 to permit the heating capacity of the heater-sensor die 111 to achieve the heating times and/or heating ramp rate required by the application, while still allowing adequate cooling rates. Additionally, the second variation can provide increased backside support to each of the set of heater-sensor dies 110 as well as increased surface for adhesion.

In specific examples of the second variation, heat sinking and supporting the "backside" of the electronics substrate 140 can be implemented across multiple heater-sensor dies 111, separated by Society for Laboratory Automation and Screening (SLAS) standard spacings, such as 9 mm, 4.5 mm or 2.25 mm spacings. The heat sink support 151 material (e.g., aluminum, copper, silver) in the specific examples is mated with the electronics substrate 140 at each heater-sensor die location, with an air gap positioned laterally between each heater-sensor die location. This configuration can further function to reduce cross talk across a set of detection chambers in contact with the set of heater-sensor dies 110. The set of heat sink supports 150 can, however, be configured in any other suitable manner to provide heat dissipation within the system 100, without obstruction of optical detection apparatus, and with provision of desired heat ramping and/or cycling behavior.

In specific examples of the second variation, heat sinking and supporting the backside (i.e., first side 141) of the electronics substrate 140 can be implemented across multiple heater-sensor dies 111, separated by Society for Laboratory Automation and Screening (SLAS) standard spacings, such as 9 mm, 4.5 mm or 2.25 mm spacings. The heat sink support 151 material (e.g., aluminum, copper, silver) in the specific examples is mated with the electronics substrate 140 at each heater-sensor die location, with an air gap between locations. This configuration can further function to reduce cross talk between at least a first detection chamber and a second detection chamber interfacing with the system 100.

The set of elastic elements 160 is preferably coupled to a first surface 104a of the electronics substrate 140, and functions to promote contact between the set of heater-sensor dies 110 and detection chambers (e.g., reaction vessels, detection chambers) for sample processing according to molecular diagnostic protocols. The set of elastic elements 160 can comprise any one more of springs and elastomeric elements, which can deform and provide transmit a biasing force, through the electronics substrate 140, to reinforce contact between a set of detection chambers and the set of heater-sensor dies 110. The set of elastic elements 160 can, however, additionally or alternatively include any other suitable elements configured to provide a biasing force that reinforces contact between a set of detection chambers and the set of heater-sensor dies 110 in an elastic or a non-elastic manner. In one such alternative variation, the system 100 can include one or more actuators configured to drive each of the set of heater-sensor dies 111 toward a corresponding detection chamber, and in another such alternative variation, the system 100 can include a set of magnets (e.g., including magnet pairs surrounding the set of heater-sensor dies 110 and a corresponding set of detection chambers), that function to reinforce coupling between the set of heater-sensor dies 110 and the set of detection chambers. However, any other suitable elements can additionally or alternatively be used to facilitate uniform and consistent coupling between the set of heater-sensor dies 110 and a set of detection chambers.

Figure 8C:
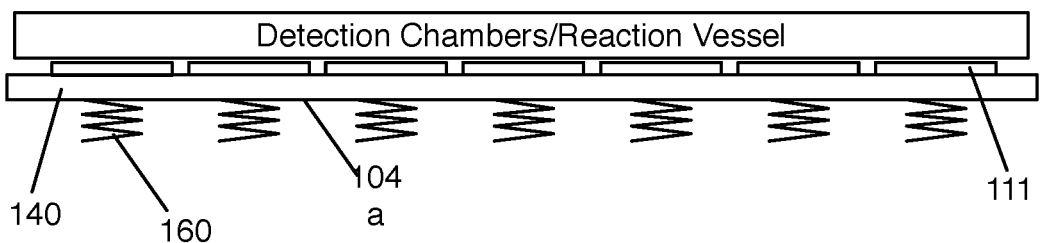

In embodiments of the system 100 including a set of elastic elements 160, the set of elastic elements 160 is preferably coupled to a first surface 104a of the electronics substrate 140, as shown in FIG. 8C, such that each elastic element in the set of elastic elements 160 facilitates contact between a heater-sensor die 111 and a corresponding detection chamber. In a first variation, the set of elastic elements 160 is coupled to first surface 104a of a flexible PCB of the electronics substrate 140, as shown in FIG. 5A. In the first variation, contact between each heater-sensor die 111 and a corresponding detection chamber is thus maintained by a biasing force provided by an individual spring through the flexible PCB of the electronics substrate 140. In the first variation, the number of elastic elements in the set of elastic elements 160 is equal to the number of heater-sensor dies in the set of heater-sensor dies 110, such that the set of elastic elements 160 and the set of heater-sensor dies 110 are paired in a one-to-one manner. Alternatives to the first variation can, however, comprise any suitable number of elastic elements in relation to a number of heater-sensor dies 110. In a second variation, the set of heater-sensor dies 110 is coupled to a second surface 104b of a rigid PCB of the electronics substrate 140, with the set of elastic elements 160 coupled to the first surface 104a of the rigid PCB. In the second variation, the set of elastic elements 160 thus functions to collectively transfer a force through the rigid PCB to maintain contact between the set of heater-sensor dies 110 and the detection chambers. Alternatives to the second variation can also comprise any suitable number of springs in relation to a number of heater-sensor dies in the set of heater-sensor dies 110. Furthermore, variations of the system 100 can include one or more elastic elements coupled to any other elements directly or indirectly coupled to the set of heater-sensor dies 110. For instance, the system 100 can additionally or alternatively include one or more springs 160' coupled to base surfaces of the set of heat-sink supports 150 interfacing with the set of heater-sensor dies, in order to transmit biasing forces.

As shown in FIG. 1, the system 100 can further comprise a controller 165, which functions to automate and/or control heating parameters provided by the set of heater-sensor dies 110. The controller 165 can further be configured to provide heat parameter output commands to the heating element(s) 114, and/or configured to receive communication of heating parameters (e.g., detected temperatures) sensed at the sensing element(s) 115 of the system 100. The controller 165 preferably comprises a proportion-integral-derivative (PID)

controller, but can alternatively be any other suitable controller 165. The controller 165 preferably interfaces with the set of heater-sensor dies 110 through the electronics substrate 140 by a connector; however, the controller 165 can interface with the set of heater-sensor dies 110 in any alternative suitable manner. Preferably, the controller 165 is configured to automate and control heat output parameters, including any one or more of: heating temperatures, heating ramp rates, heating times (e.g., holding times), and any other suitable heating parameter(s). Furthermore, the controller 165 can be configured to control individual heater-sensor dies 111 in order to provide unique heating parameters for individual detection chambers and/or can be configured to provide common heating parameters for all heater-sensor dies 111 in the set of heater-sensor dies 110. In a specific example, the controller 165 comprises a Yokogawa UT750 PID controller, an Arduino UNO R3 microcontroller configured to cycle the UT750 through temperature stages and to control temperature holding, a resistance-to-voltage conversion circuit, and two power supplies—a first power supply configured to supply power to the set of heater-sensor dies 110 and a second power supply configured to supply voltage to the resistance-to-voltage conversion circuit. In the specific example, the controller 165 comprises a resistance-to-voltage conversion circuit because the UT750 PID controller requires voltage as an input for PID control. In another specific example, the controller 165 comprises a National Instruments LabView based system comprised of an NI cDAQ-9178 chassis with an NI 9219 universal analog input card and an NI 9485 eight-channel solid-state relay sourcing or sinking digital output module solid-state relay card. In this specific example, the cDAQ-9178 supports the NI 9219 and NI 9485 cards, the NI 9219 is used to obtain the RTD inputs, and the NI 9485 cycles the power supply voltage to individual heater-sensor dies of the set of heater-sensor dies 110. Further, in this specific example, the controller 165 is expandable to 12 or more channels through the use of additional NI 9219 and NI 9485 cards, each of which can handle several channels.

Figure 9C:
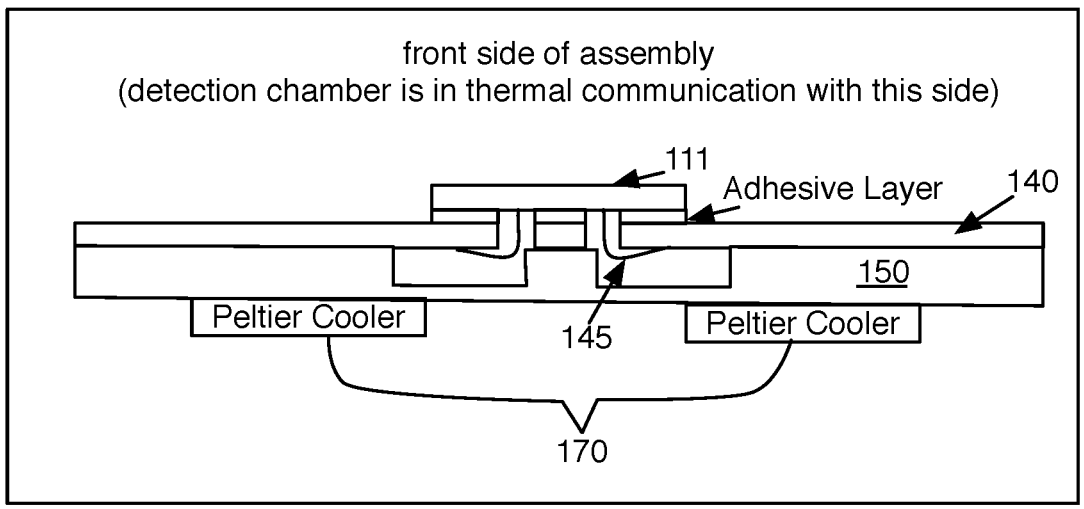

As shown in FIGS. 9A and 9B, the system 100 can further comprise a cooling subsystem 170, which functions to provide heat transfer from the system 100 in order to further enhance controlled heating and cooling by the system 100. The cooling subsystem 170 is preferably configured to provide at least one of convective cooling and conductive cooling of the system 100, but can alternatively be configured to provide any other suitable cooling mechanism or combination of cooling mechanisms. In one variation, the cooling subsystem 170 can comprise a fan 171 that provides convective heat transfer from the system 100. In this variation, the fan 171 can be coupled to any suitable element of the system 100, such as the set of heat sink supports 150, as shown in FIG. 9A. Furthermore, alternatives to this variation can comprise any suitable number of fans of any suitable dimension and configuration, examples of which are shown in FIGS. 9A and 9B. In one such example, the system can include a set of cooling elements integrated with each heat sink support of the set of heat sink supports. In another variation, the cooling subsystem 170 can additionally or alternatively comprise a Peltier device, as shown in FIG. 9C. The Peltier device can be cooled and maintained at a defined temperature (e.g., in the 10-25 C range) to provide a substantial temperature gradient for cooling during a thermal cycling process, which can decrease cooling times and/or cycle times. In yet another variation, the cooling subsystem 170 can additionally or alternatively comprise a liquid cooling system (e.g., water cooling system) configured to surround and absorb heat from one or more heater-sensor dies of the set of heater-sensor dies 110, for instance, by way of the set of heat sink supports 150. The cooling subsystem 170 can additionally or alternatively comprise any other suitable cooling element(s).

In some variations, reflection from the set of heater-sensor dies 110 can interfere with light transmitted to photodetectors of an optical subsystem opposed (e.g., directly opposed, in opposition) to the set of heater-sensor dies 110 (e.g., light emitted from the set of biological samples, light transmitted through filters of an optical subsystem), especially in configurations wherein a set of detection chambers is configured between the set of heater-sensor dies and optical elements of an optical subsystem. In these variations, the set of heater-sensor dies 110 can include elements that reduce or eliminate reflection from any portion of the set of heater-sensor dies (e.g., reflection from the heating region, etc.), thereby facilitating analysis of a set of biological samples within the set of detection chambers. In one variation, the set of heater-sensor dies 110 can include or be coupled to one or more non-reflective coatings 180 at surfaces of the set of heater-sensor dies 110 upon which light from the optical subsystem impinges. In a specific example, the non-reflective coating 180 can comprise a high-temperature paint (e.g., dark paint, flat paint) that functions to absorb and/or diffuse light from an opposing optical subsystem, while facilitating heat transfer to a set of detection chambers in thermal communication with the set of heater-sensor dies 110. In another variation, the set of heater-sensor dies 110 can be configured to be in misalignment with photodetectors of the optical subsystem, such that reflection does not interfere with light transmitted to the photodetectors of the optical subsystem. In one example, the set of heater-sensor dies 110 can be configured to heat a set of detection chambers from a first direction, and the optical subsystem can be configured to receive light from the set of detection chambers from a second direction (e.g., a direction non-parallel to the first direction), such that reflection from the set of heater-sensor dies 110 does not cause interference. In still other variations, the set of heater-sensor dies 110 can include any other suitable elements (e.g., coatings, layers, etc.) and/or be configured in any other suitable manner that eliminates, prevents, or mitigates reflection from the set of heater-sensor dies 110 from interfering with light transmitted to photodetectors of an optical subsystem in opposition to the set of heater-sensor dies 110.

Variations of the system 100 can, however, include any other suitable element(s) configured to provide uniform, accurate, precise, and reliable heating of one or more detection chambers in thermal communication with the system 100. Furthermore, as a person skilled in the art will recognize from the previous detailed description and from the figures, modifications and changes can be made to the preferred embodiments of the system 100 without departing from the scope of the system 100.

2. Method of Assembly

Figure 10:
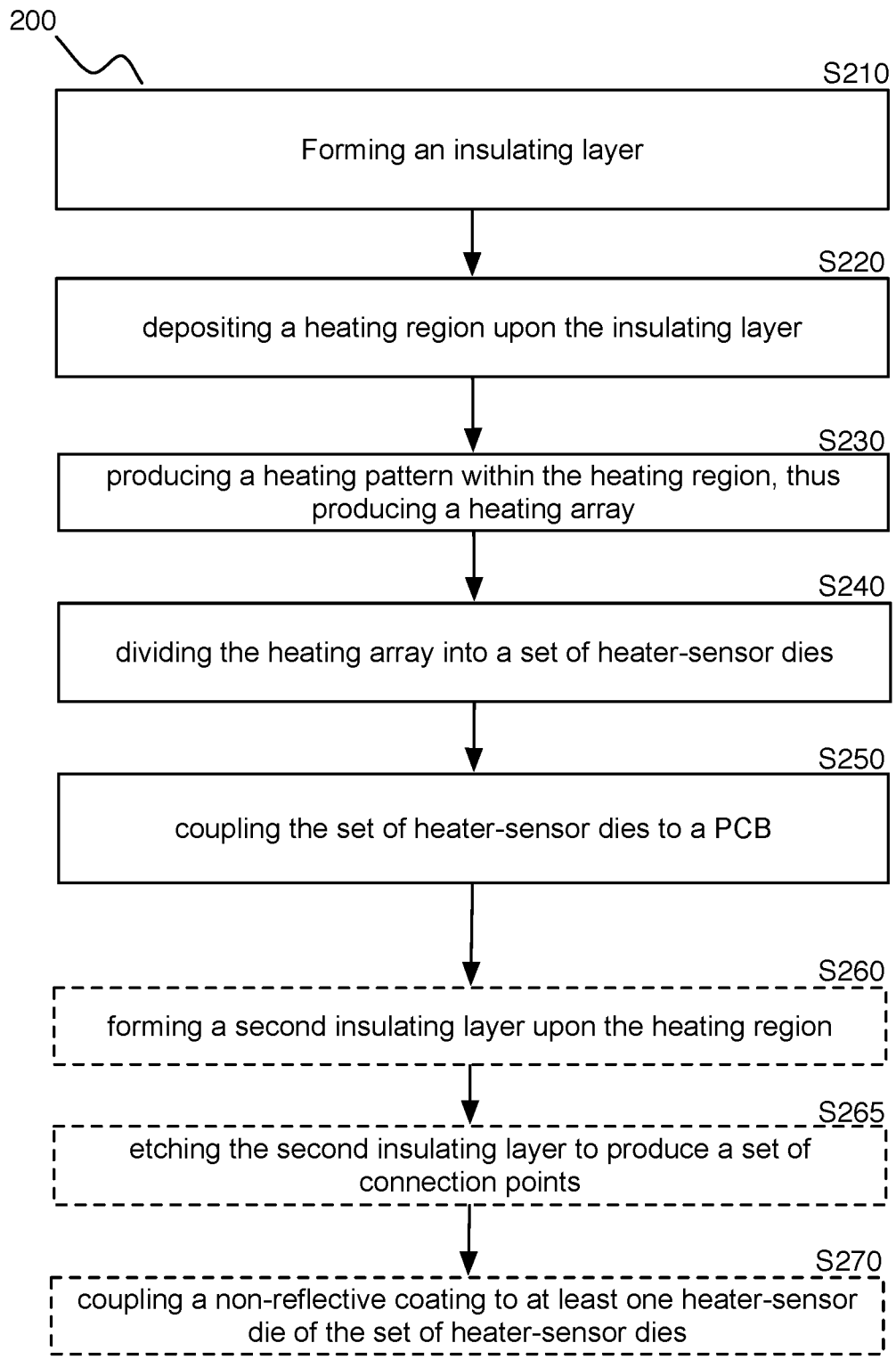
FIG. 10 depicts a flowchart of a method for assembling an embodiment of a thermocycling system.

As shown in FIG. 10, a method 200 of assembling an embodiment of a thermocycling system 100 comprises forming a first insulating layer coupled to exposed surfaces of a substrate S210; depositing a heating region upon the first insulating layer S220; producing a heating pattern within the heating region, thus producing a heating array S230; dividing the heating array into a set of heater-sensor dies S240; and coupling the set of heater-sensor dies to a electronics substrate S250. The method 200 can further comprise forming a second insulating layer upon the heating region S260, which functions to electrically isolate the heating region on a first side and a second side. The method 200 functions to produce a thermocycling system 100, embodiments, variations, and examples of which are described above, wherein the thermocycling system 100 provides rapid and uniform thermocycling of samples and comprises elements configured to prevent mechanical failure.

Block S210 recites: forming a first insulating layer coupled to exposed surfaces of a substrate, and functions to generate a layer that electrically insulates the heating region deposited in Step S220. The substrate is preferably a silicon substrate, but can alternatively be any other suitable semiconducting, or non-conducting substrate. As such, in variations, the substrate can be composed of a semi-conducting material (e.g., silicon, quartz, gallium arsenide), and/or an insulating material (e.g., glass, ceramic). In some variations, the substrate 130 can even comprise a combination of materials (e.g., as in a composite, as in an alloy). In examples wherein the substrate is a silicon substrate, the substrate can be composed of silicon with any suitable type (e.g., P-type), doping (e.g., boron-doping), miller index orientation, resistivity, thickness, total thickness variation, and/or polish.

In forming the first insulating layer, Block S210 can be performed using any one or more of: thermal oxide growth, chemical vapor deposition (CVD), spin coating, spray coating, and any other suitable method of depositing a localized layer of an insulating material. Preferably, the first insulating layer is composed of an insulating oxide material, and in examples can include any one or more of: a thermally grown silicon oxide, a chemical vapor deposited oxide, a deposited titanium oxide, a deposited tantalum oxide, and any other suitable oxide grown and/or deposited in any other suitable manner. However, the first insulating layer can additionally or alternatively include an insulating polymer (e.g., a polyimide, a cyanate ester, a bismaleimide, a benzoxazine, a phthalonitrile, a phenolic, etc.) that is chemical and heat resistant and/or any other suitable material (e.g., chemical vapor deposited nitride, other nitride, paralene, etc.) that is configured to provide the first insulating layer.

In one example of Block S210, the first insulating layer comprises an oxide material, and is formed by growing the oxide material on a substrate. In one example of Block S210, the insulating layer comprises a 0.2 mm layer of silicon oxide, and is formed on a 100 mm silicon wafer using thermal oxidation at 900° C. using water vapor (i.e., in wet oxidation) or oxygen (i.e., in dry oxidation) as the oxidant. In alternative variations and examples of Block S210, the first insulating layer can be formed using high or low temperature thermal oxidation, using any suitable oxidant, and/or using any other suitable method (e.g., fluid deposition of an electrically insulating polymer, softbaking/hardbaking of a deposited polymer, etc.).

Block S220 recites depositing a heating region upon the insulating layer, and functions to form a thermally conductive substrate that is robust during rapid thermocycling. Preferably, the heating region comprises a metal or a metal alloy and can comprise multiple layers; however, the heating region can alternatively comprise any suitable thermally conducting material, and can comprise any suitable number of layers. Additionally, the heating region is preferably deposited in a uniform layer; however, the heating region can be deposited non-uniformly in other variations. In one variation, the heating region comprises an adhesion material layer and a noble material layer, wherein the noble material layer is deposited upon the adhesion material layer after the adhesion material layer is deposited upon the first insulating layer. In examples of this variation, the adhesion layer can comprise chromium or titanium, and the noble layer can comprise gold or platinum. In one example of Block S220, the conductive material(s) of the heating region is(are) deposited using an evaporation process; however, in other examples, the conductive material(s) can be deposited by sputtering, plating (e.g., chemical plating, electrochemical plating), or any other suitable method (e.g., electrodeposition). Furthermore, in examples wherein a heating region material is evaporated or sputtered, the insulating layer-substrate subassembly generated in Block S210 can be translated or rotated in order to facilitate uniform deposition of the heating region material.

Figure 11A:
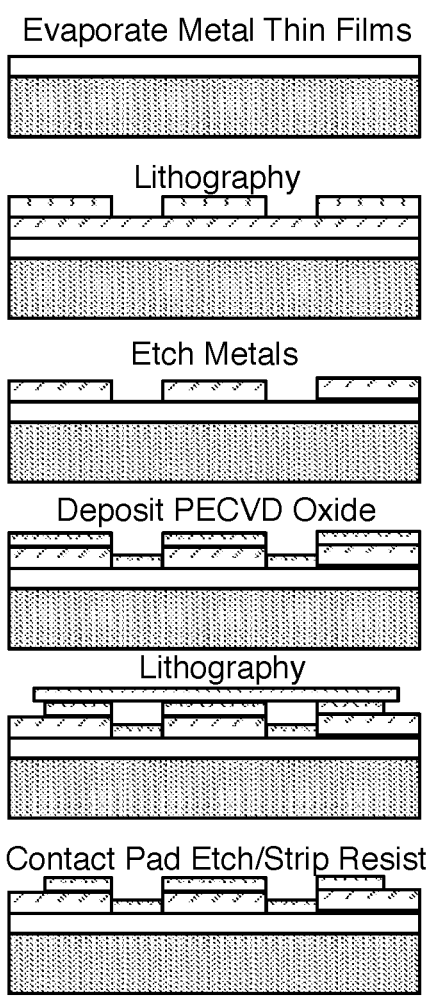
FIGS. 11A-11B depict variations of a method for assembling an embodiment of a thermocycling system.
Figure 11B:
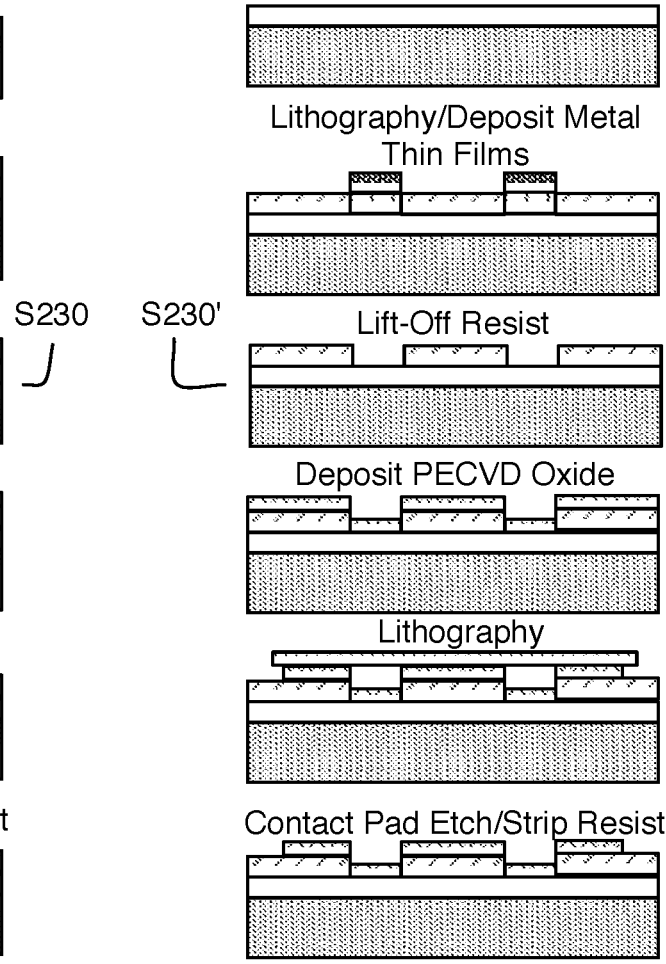

Block S230 recites producing a heating pattern within the heating region, and functions to produce a heating array characterized by a heating pattern that provides uniform heating and desirable resistances for heating elements and/or sensing elements (e.g., RTDs) defined within the heating region. As such, Block S240 preferably produces a heating pattern having geometric features (e.g., width, thickness, length, spacing) that facilitate uniform heating and provide desired heating and sensing characteristics (e.g., resistance characteristics). In some variations, the pattern can define any one or more of: linear segments, non-linear segments, boustrophedonic segments, continuous segments, non-continuous segments, and any other suitable segment(s) having any other suitable geometry (i.e., width, depth, height, length, path, etc.) In a specific example, the heating pattern was designed using a layout editor (e.g., Mentor Graphics™ or L-Edit™), and comprises a boustrophedonic pattern that is coarse for heating elements and fine for sensing elements. In alternative variations, the heating pattern can be designed using any other suitable method, and can alternatively or additionally comprise any features that contribute to uniform heating and/or suitable resistance ranges. During implementation of Block S230, the heating pattern can be produced photolithographically using a positive resist process, as shown in FIG. 11A. In one example, the heating region can be covered with positive photoresist (e.g., a photomask designed according to the heating pattern) and lithographically etched in exposed regions. In the example, the positive photoresist can then be removed to reveal the heating pattern. In other variations, the heating pattern can be produced using any lithographic method, using positive and/or negative etching to form the heating pattern, and/or using any other suitable method. In one example of an alternative implementation of Step S230', the heating pattern can be produced using a lift-off process, as shown in FIG. 11B, wherein a sacrificial layer is used to define the heating pattern, the heating region material(s) is(are) deposited, and then the sacrificial layer is removed to reveal the heating pattern.

Block S240 recites dividing the heating array into a set of heater-sensor dies, and functions to divide the heating array into a set of heater-sensor dies configured to heat multiple detection chambers (e.g., reaction vessels, sample containers, wells of a plate, chambers of a cartridge) in parallel (e.g., simultaneously, in sequence). Block S240 can also comprise cleaning and drying the heating array prior to and/or after dividing the heating array into a set of heater-sensor dies. Upon completion of Block S240, individual heater-sensor dies of the set of heater-sensor dies can be coupled to one or multiple electronics substrates in order to provide uniform heating of individual sample containers with independent control of heating parameters provided at each of the set of heater-sensor dies. In Block S240, the heating array is preferably divided using a dicing method (e.g., mechanical dicing by saw, laser dicing, water cutting, stealth dicing, etc.), but can additionally or alternatively be divided using any other suitable method (e.g., dice before grind). Furthermore, the heating array is preferably divided into rectangular dies, but can alternatively be divided into dies of any suitable morphology (e.g., polygonal dies, non-polygonal dies, circular dies, ellipsoidal dies, etc.). In a specific example, as shown in FIG. 3A, each heater-sensor die produced after division of the heating array has dimensions of approximately 8.6 mm×7 mm, with a circular heating surface that is 5 mm in diameter.

Block S250 recites coupling the set of heater-sensor dies to an electronics substrate, and functions to provide a set of robust connections between the set of heater-sensor dies and an electronics substrate. Coupling in Step S250 comprises forming an electrical connection between connection points on the heater-sensor dies and the electronics substrate, which enables driving of a heating current from the electronics substrate to each of the set of heater-sensor dies (e.g., simultaneously, non-simultaneously). The electrical connection can be provided by a conducting wire (e.g., aluminum wire, gold wire, copper wire) of any suitable thickness (e.g., 10-200 microns), or by soldering. Furthermore, coupling in Block S250 preferably comprises coupling heater-sensor dies with a suitable center-to-center spacing that accommodates the spacing of detection chambers intended to be heated by the system. In a specific example, coupling in Block S250 comprises providing a center-to-center spacing between heater-sensor dies of 9 mm, 4.5 mm, or 2.25 mm according to Society of Laboratory Automation Standards (e.g., SLAS Microplate Standards).

Preferably, for a heater-sensor die, Block S250 comprises forming a reverse wire bond between a connection point (i.e., pad) on the heater-sensor die and a connection point (i.e., pad) on the electronics substrate, as shown in FIGS. 5A-5B and 6A-6D. The reverse wire bond prevents unbonding of a heater-sensor die from the electronics substrate, which can be caused due to mechanical forces on the wire bond and/or heater-sensor die, or fatigue failure of a connection. In Block S250, the reverse wire bond is preferably made from a back-side of the electronics substrate, in the orientation shown in FIGS. 5A-5B, through an aperture defined within the electronics substrate. The aperture can be a single aperture, or a set of apertures, and furthermore, multiple heater-sensor dies of the set of heater-sensor dies 110 can be configured to couple to the electronics substrate through an aperture defined within the electronics substrate. The mappings between pads on the heater-sensor dies and the electronics substrate can be one-to-one or many-to-one in variations of coupling. Also shown in FIGS. 5A-5B, Block S250 can additionally comprise depositing an adhesive layer comprising cyanoacrylate and/or any other suitable adhesive material between a heater-sensor die and the electronics substrate.

In a first variation, as shown in FIG. 6A, Block S250 comprises coupling a heater-sensor die to a first side of the electronics substrate by a wire bond that passes through an aperture defined within the electronics substrate, such that the wire bond couples at one end to a second side of the electronics substrate. In this variation, a connection point on a surface of the heater-sensor die closer to the first side of the electronics substrate is coupled to a connection point on the second side of the electronics substrate, by way of the aperture and the reverse wire bond. In the first variation of Block S250, the heater-sensor die can be further stabilized in place by depositing an adhesive layer at the first side of the electronics substrate.

In a second variation, as shown in FIG. 6B, Block S250 comprises coupling a heater-sensor die to a first side of the electronics substrate by a wire bond that passes into an aperture defined within the electronics substrate. In this variation, the wire bond is configured to couple, at one end, to a surface of the heater-sensor die closer to the first side of the electronics substrate, and configured to terminate at a connection point part-way between a first side and a second side of the electronics substrate, such that the wire bond is not exposed at the second side of the electronics substrate. In the second variation of Block S250, the heater-sensor die 111 can also be stabilized in place by depositing an adhesive layer at the first side of the electronics substrate.

In a third variation, as shown in FIGS. 6C-6D, Block S250 comprises providing a recess within the electronics substrate at a first side of the electronics substrate, and coupling (e.g., mounting) a heater-sensor die within the recess of the electronics substrate, wherein the recess is connected to (e.g., contiguous with) an aperture defined within the electronics substrate. Providing the recess of the third variation preferably comprises forming the electronics substrate with a recess and aperture contiguous with the recess, wherein examples of forming can include any one or more of: molding (e.g., injection molding), casting, printing (e.g., 3D printing), and any other suitable method of forming the electronics substrate. Providing the recess of the third variation can additionally or alternatively comprise a method of removing material from a substrate, such as etching, machining (e.g., drilling, milling), and any other suitable method of material removal.

As shown in FIG. 6C, a first example of providing the recess of Block S250 can include providing a recess that is configured such that a heating surface of the heater-sensor die is flush with a first surface of the electronics substrate; however, in an example shown in FIG. 6D, providing the recess can include providing a recess that is configured such that a heating surface of the heater-sensor die is not flush with the first surface of the electronics substrate. In the third variation of Block S250, the wire bond is configured to couple, at one end, to a surface of the heater-sensor die partially situated within the electronics substrate, and configured to terminate at a connection point either part-way between the first side and a second side of the electronics substrate (as in the second variation of Block S250), or at a termination point at the second side of the electronics substrate (as in the first variation of Block S250). Thus, the third variation of Block S250 comprises stabilizing a surface of the heater-sensor die within the recess of the electronics substrate to further prevent shearing or other forms of mechanical failure that could compromise a connection between the heater-sensor die and the electronics substrate. In the third variation, the heater-sensor die can also be further stabilized by providing an adhesive layer within the recess.

In other variations, Block S250 can comprise coupling each heater-sensor die to the electronics substrate by any other suitable method. In one such variation of Block S250, coupling can comprise a "top-side" wire bond, in the orientation shown in FIG. 7A. In this variation, Block S250 comprises coupling a thin wire (e.g., 10-300 microns thick) composed of an electrically conductive material (e.g., aluminum, gold, or copper wire) between a connection point on the heater-sensor die and a connection point on the top side electronics substrate (in the orientation shown in FIG. 7A). Furthermore, in this variation, the "top-side" wire bonds are potted, embedded, or encapsulated to protect them from mechanical failure. In another alternative variation, coupling in Block S250 can comprise forming a flip-chip bond, as shown in FIG. 7B. In this variation, Block S250 can include providing a volume (e.g., ball) of solder configured between a connection point on a heater-sensor die and a connection point on the electronics substrate. Furthermore, in this variation, Block S250 can additionally comprise depositing a filler material within regions between the electronics substrate and the heater-sensor die not connected by a volume of solder, in order to further stabilize the assembly. In other variations, the coupling can additionally or alternatively comprise any suitable adhesive (e.g., cyanoacrylate adhesive).

Wire bonding in variations of Block S250 can comprise any suitable combination of the above variations, and can additionally or alternatively comprise any suitable encapsulation, embedding, or potting of wire bonds to further prevent failure in the wire bonds. Furthermore, while variations of Block S250 are described for coupling of a set of heater-sensor dies to an electronics substrate, Block S250 can alternatively comprise coupling of a single heater-sensor die to the electronics substrate, in order to produce a single heating surface configured to heat a detection chamber in thermal communication with the heater-sensor die. However, Block S250 can alternatively comprise coupling any suitable number of heater-sensor dies to any suitable number of electronics substrates.

As shown in FIG. 10, the method 200 can further comprise Block S260, which recites forming a second insulating layer upon the heating region. Block S260 functions to electrically isolate the heating region on a first side and a second side of the heating region, and is preferably performed prior to coupling of the set of heater-sensor dies to the electronics substrate. However, Block S260 can alternatively be performed at any other suitable time relative to other blocks of the method 200. Preferably, Block S260 comprises depositing (e.g., electrodepositing, using CVD) or growing (e.g., by thermal oxidation) an oxide on the heating region, such that the heating region is "sandwiched" between two oxide layers; however, Block S260 can additionally or alternatively comprise depositing any other suitable insulating material by any suitable method at another surface of the heating region. In one variation, Block S260 comprises depositing a low temperature oxide by chemical vapor deposition (e.g., plasma-enhanced chemical vapor deposition) to form the second insulating layer, and in other variations, Block S260 can comprise fluid deposition of an insulating material (e.g., inkjet printing or casting of an electrically insulating polymer, softbaking/hardbaking of a deposited polymer, etc.) onto desired portions of the heating region.

In variations of the method 200 comprising Block S260, the method 200 can also further comprise Block S265, which recites removing material of the second insulating layer to produce a set of connection points. Block S265 functions to provide access to the heating region between insulation regions, such that the heating region can be electrically connected to the electronics substrate. The set of connection points can be defined using a material removal method including any one or more of: etching (e.g., lithography, laser etching), machining (e.g., drilling), and any other suitable method of material removal. In one such variation of Block S265, the set of connection points can be defined photolithographically using a positive resist process in a manner similar to that used in a variation of Block S230. In one example of this variation, the second insulating layer can be covered with positive photoresist and lithographically etched in exposed regions. In the example, the positive photoresist can then be removed to reveal the connection points. In other variations, the connection points can be defined using any lithographic method, using positive and/or negative etching to form the heating pattern, and/or using any other suitable method. Upon definition of the connection points, the second insulating layer can further be etched (e.g., using buffered hydrofluoric acid) as an additional surface treatment. Alternative variations of Block S265 can include additionally or alternatively removing material from the first insulating surface of Block S210 to form any subset of the set of connection points.

As shown in FIG. 10, the method 200 can further include Block S270, which recites: coupling a non-reflective coating to at least one heater-sensor die of the set of heater-sensor dies. Block S270 functions to process at least a subset of the set of heater-sensor dies 110 so that they do not interfere with light transmitted to photodetectors of an optical subsystem opposed (e.g., directly opposed, in opposition) to the set of heater-sensor dies 110 (e.g., light emitted from the set of biological samples, light transmitted through filters of an optical subsystem), especially in configurations wherein a set of detection chambers is configured between the set of heater-sensor dies and optical elements of an optical subsystem. The non-reflective coating is preferably coupled identically to all heater-sensor dies of the set of heater sensor dies; however, the non-reflective coating can alternatively be coupled non-identically to one or more heater-sensor dies of the set of heater-sensor dies. As such, in variations, one or more subsets of the set of heater-sensor dies can be coupled to non-reflective coatings in a manner that provides different light reflection properties for the subset(s) of the set of heater-sensor dies.

In Block S270, the non-reflective coating is preferably a material layer that is applied superficial to at least one of the first insulating layer and the second insulating layer processed in variations of Blocks S210 and S260, respectively. In one example, the non-reflective coating processed in Block S270 can comprise a high-temperature paint (e.g., dark paint, flat paint) that functions to absorb and/or diffuse light from an opposing optical subsystem, while facilitating heat transfer to a set of detection chambers in thermal communication with the set of heater-sensor dies. In this example, the high-temperature paint can be applied by any one or more of: brushing, spraying, dipping, printing, and any other suitable method of coupling the high-temperature paint to one or more surfaces of at least a subset of the set of heater-sensor dies. However, the non-reflective coating can alternatively be processed simultaneously with or can comprise one or more of the first insulating layer and the second insulating layer processed in variations of Blocks S210 and S260, respectively. For instance, one or more of the first and the second insulating layer can include a modified oxide layer that has low-reflectivity, thus preventing interference caused by light reflected from the set of heater-sensor dies. In some extreme variations, however, mitigation of interference due to reflected light from the set of heater-sensor dies can be produced by configuring the set of heater-sensor dies to be in misalignment with photodetectors of the optical subsystem, such that reflection does not interfere with light transmitted to the photodetectors of the optical subsystem, in modified versions of Block S270. For instance, the set of heater-sensor dies can be configured to heat a set of detection chambers from a first direction, and the optical subsystem can be configured to receive light from the set of detection chambers from a second direction (e.g., a direction non-parallel to the first direction), such that reflection from the set of heater-sensor dies 110 does not cause interference. In still other variations of Block S270, the set of heater-sensor dies can be processed with any other suitable elements (e.g., coatings, layers, etc.) and/or be configured in any other suitable manner that eliminates, prevents, or mitigates reflection from the set of heater-sensor dies from interfering with light transmitted to photodetectors of an optical subsystem in opposition to the set of heater-sensor dies 110.

The method 200 can further comprise any other suitable block, such as calibrating sensing elements of the thermocycling system S280. In an example of Block S270, the set of heater-sensor dies coupled to the electronics substrate can be installed in thermal chamber to calibrate the sensing elements (i.e., RTDs) of the set of heater-sensor dies. In the example, the electronics substrate and a first connector end of a calibration system was placed in a thermal chamber and a second connector end of the calibration system was attached to an array of contacts outside the thermal chamber. The thermal chamber was allowed to equilibrate in stages at a series of temperatures spanning the expected dynamic range of the RTDs, from 30 C to 100 C in four stages. The RTD resistance values were read out at the various equilibrated temperatures, and fit a Callendar-Van Dusen equation. The calibration of the example of Block S270 yielded the coefficients used to convert the sensing element resistance values to temperature values, in order to calibrate the sensing elements of the system.

The system 100 and/or method 200 of the preferred embodiment and variations thereof can be embodied and/or implemented at least in part as a machine configured to receive a computer-readable medium storing computer-readable instructions. The instructions are preferably executed by computer-executable components preferably integrated with the system 300 and one or more portions of the processor 350. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

The FIGURES illustrate the architecture, functionality and operation of possible implementations of methods according to preferred embodiments, example configurations, and variations thereof. In this regard, each block in the flowchart or block diagrams may represent a module, segment, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method of manufacturing a thermocycling system, the method comprising:
    forming a first insulating layer at exposed surfaces of a substrate;
    depositing a heating region onto the first insulating layer of the substrate;
    patterning the heating region to define a heating array having a set of heating elements and a set of sensing elements distinct from the heating elements, the heating region including multiple sensing elements distributed at different locations within the heating region;
    dividing the heating array into a set of heater-sensor dies, each heater-sensor die comprising a heating surface, including a heating element of the set of heating elements and a sensing element of the set of sensing elements, and each heater-sensor die comprising a second surface, inferior to the heating surface, including a first connection point;
    providing an electronics substrate having a first substrate surface configured to couple to the second surface of each of the set of heater-sensor dies, an aperture providing access through the electronics substrate to at least one of the set of heater-sensor dies, and a second substrate surface inferior to the first substrate surface; and
    coupling a conductor from the first connection point of at least one of the set of heater-sensor dies, to a second connection point of the electronics substrate, through the aperture of the electronics substrate.

2. The method of claim 1, wherein coupling the conductor comprises coupling a first end of the conductor to the first connection point, passing the conductor through the aperture, and coupling a second end of the conductor to the second connection point at the second substrate surface.

3. The method of claim 1, wherein coupling the conductor comprises coupling a first end of the conductor to the first connection point, passing the conductor into the aperture, and coupling a second end of the conductor to an internal surface of the aperture.

4. The method of claim 1, wherein providing the electronics substrate comprises defining a set of apertures spaced across the electronics substrate and defining a set of recesses, each recess of the set of recesses contiguous with at least one aperture of the set of apertures.

5. The method of claim 4, further comprising coupling the second surface of each of the set of heater-sensor dies, within a corresponding recess of the set of recesses, with an adhesive layer that maintains coupling between the set of heater-sensor dies and the electronics substrate.

6. The method of claim 4, wherein coupling the conductor comprises coupling a heater-sensor die of the set of heater-sensor dies to the first substrate surface with an adhesive layer, and coupling a first end of the conductor to the first connection point, passing the conductor into a recess of the set of recesses, and coupling a second end of the conductor to the second connection point at a surface of at least one of the recess and an aperture contiguous with the recess.

7. The method of claim 1, further comprising coupling a coating, proximal to the heating surface of at least one heater-sensor die of the set of heater-sensor dies, wherein the coating is operable to mitigate reflection of light from the heating surface toward photodetectors of an optical subsystem opposed to the heating surface during operation of the thermocycling system.

8. A method of manufacturing a thermocycling system, the method comprising:
- forming a first insulating layer at exposed surfaces of a substrate;
- depositing a heating region onto the first insulating layer of the substrate;
- removing material of the heating region, thereby forming a heating array with a pattern that defines a set of heating elements and a set of sensing elements within the heating array;
- dividing the heating array into a set of heater-sensor dies, each heater-sensor die comprising a heating surface, including a heating element of the set of heating elements and a sensing element of the set of sensing elements, and each heater-sensor die comprising a second surface, inferior to the heating surface, including a first connection point;
- providing an electronics substrate having a first substrate surface configured to couple to the second surface of each of the set of heater-sensor dies, an aperture providing access through the electronics substrate to at least one of the set of heater-sensor dies, and a second substrate surface inferior to the first substrate surface; and
- coupling a conductor from the first connection point of at least one of the set of heater-sensor dies, to a second connection point of the electronics substrate, through the aperture of the electronics substrate, wherein
- depositing the heating region comprises coupling an adhesion material layer to the first insulating layer, and coupling a noble material layer to the adhesion material layer, and wherein
- forming the heating array with the pattern comprises defining a pattern of voids through the adhesion material layer and the noble material layer, wherein coarse elements of the pattern define heating elements of the heating array and fine elements of the pattern, integrated within coarse elements of the pattern, define sensing elements of the heating array.

9. The method of claim 8, wherein the electronics substrate is a printed circuit board, and coupling the conductor from the first connection point to the second connection point comprises coupling the first connection point to the printed circuit board.

10. The method of claim 9, wherein coupling the first connection point to the printed circuit board comprises forming a reverse wire bond between the first connection point and a pad on a back side of the printed circuit board.

11. The method of claim 8, wherein coupling the first connection point to the printed circuit board provides communication with a controller for automating operation of the set of heating elements and the set of sensing elements.

12. The method of claim 8, further comprising applying a non-reflective coating to a surface of at least one of the heater-sensor dies.

13. The method of claim 11, wherein applying the non-reflective coating comprises applying a high-temperature paint to the surface of at least one of the heater-sensor dies.

14. A method of manufacture, comprising:
- forming an insulating layer on exposed surfaces of a substrate;
- depositing a heating region on the insulating layer;
- patterning the heating region to define a heating array comprising:
  - a central circular heating element and two circumferential heating elements defined by coarse patterning, and
  - sensing elements defined by fine patterning;
- dividing the heating array into a set of heater-sensor dies, each heater-sensor die including a heating element, a sensing element, and a connection point; and
- coupling the set of heater-sensor dies to a controller.

15. The method of claim 14, wherein depositing the heating region further comprises depositing an adhesion layer.

16. The method of claim 14, wherein depositing the heating region further comprises depositing a noble material layer.

17. The method of claim 14, wherein patterning the heating region with coarse and fine patterns comprises forming a boustrophedonic pattern.

18. The method of claim 17, wherein coupling the heater-sensor dies to a controller comprises connecting the boustrophedonic pattern to a back side of an electronics substrate using a reverse wire bond.

19. The method of claim 14, wherein patterning the heating region comprises forming a uniform pattern to substantially uniformly heat a circular region.

20. The method of claim 14, further comprising forming a second layer upon the heating region and etching the second insulating layer to produce a set of connection points.

* * * * *